United States Patent
Tournabien et al.

(10) Patent No.: US 12,016,161 B2
(45) Date of Patent: Jun. 18, 2024

(54) POWER CONDUCTOR AND VEHICLE POWER DISTRIBUTION CIRCUIT INCORPORATING THE SAME

(71) Applicant: Aptiv Technologies AG, Schaffhausen (CH)

(72) Inventors: Guillaume Tournabien, Dublin (IE); Leo Delas, Dublin (IE)

(73) Assignee: Aptiv Technologies AG, Schaffhausen (CH)

( * ) Notice: Subject to any disclaimer, the term of this patent is extended or adjusted under 35 U.S.C. 154(b) by 26 days.

(21) Appl. No.: 17/810,501

(22) Filed: Jul. 1, 2022

(65) Prior Publication Data

US 2023/0007816 A1 Jan. 5, 2023

(30) Foreign Application Priority Data

Jul. 1, 2021 (GB) .................................... 2109529

(51) Int. Cl.
*H05K 7/20* (2006.01)
*B60R 16/023* (2006.01)
*H01B 7/42* (2006.01)

(52) U.S. Cl.
CPC ..... *H05K 7/20881* (2013.01); *B60R 16/0239* (2013.01); *H01B 7/423* (2013.01); *H01B 7/428* (2013.01); *H05K 7/20327* (2013.01); *H05K 7/20336* (2013.01); *H05K 7/2039* (2013.01); *H05K 7/20309* (2013.01); *H05K 7/20318* (2013.01)

(58) Field of Classification Search
CPC ........... H05K 7/20881; H05K 7/20327; H05K 7/20336; H05K 7/2039; H05K 7/20309; H05K 7/20318; H05K 7/2089; H05K 7/209; H05K 7/20845; B60R 16/0239; H01B 7/423; H01B 7/428
See application file for complete search history.

(56) References Cited

U.S. PATENT DOCUMENTS

| 3,962,529 A | 6/1976 | Kubo |
| 5,647,429 A * | 7/1997 | Oktay ................ H05K 7/20809 |
| | | 165/104.33 |
| 9,065,272 B2 | 6/2015 | Simi |

(Continued)

FOREIGN PATENT DOCUMENTS

| CN | 109935415 | 6/2019 |
| CN | 212570517 | 2/2021 |

(Continued)

OTHER PUBLICATIONS

DE-102018000284-A1 Translation.*

(Continued)

*Primary Examiner* — Jacob R Crum
*Assistant Examiner* — Matthew Sinclair Muir
(74) *Attorney, Agent, or Firm* — Harness, Dickey & Pierce, P.L.C.

(57) ABSTRACT

A power conductor for conducting electricity between a power source and a load is disclosed. A conductive body connects between the power source and the load. A sealed chamber is provided in the interior of the conductive body and contains a working fluid for changing phase when heated. A circuit, a vehicle power distribution circuit, and a vehicle incorporating the same are also disclosed.

22 Claims, 1 Drawing Sheet

(56) References Cited

U.S. PATENT DOCUMENTS

| | | | |
|---|---|---|---|
| 9,116,320 B1* | 8/2015 | Laws | G02B 6/4401 |
| 9,541,970 B2* | 1/2017 | Wu | F28D 15/0233 |
| 10,494,119 B2* | 12/2019 | Smith | H05K 7/209 |
| 10,847,285 B1* | 11/2020 | Kim | H01B 7/423 |
| 10,933,725 B2* | 3/2021 | Ries-Mueller | B60K 11/06 |
| 10,946,818 B2 | 3/2021 | Takamatsu et al. | |
| 2004/0163858 A1 | 8/2004 | Borrego et al. | |
| 2009/0025952 A1* | 1/2009 | Holmes | B60K 6/405 |
| | | | 475/5 |
| 2015/0326022 A1 | 11/2015 | Baragona et al. | |
| 2018/0192545 A1* | 7/2018 | Chen | H05K 7/20409 |
| 2020/0022279 A1* | 1/2020 | Adam | H05K 1/184 |
| 2020/0031295 A1 | 1/2020 | Miller et al. | |
| 2021/0219428 A1* | 7/2021 | Ingelhag | H01L 23/427 |
| 2023/0001869 A1 | 1/2023 | Gronau et al. | |

FOREIGN PATENT DOCUMENTS

| | | | |
|---|---|---|---|
| DE | 102018000284 A1 * | 7/2018 | |
| GB | 1433158 | 4/1976 | |
| GB | 2001748 | 2/1979 | |
| JP | S57115120 | 7/1982 | |
| JP | S59154712 | 9/1984 | |
| JP | S59154713 | 9/1984 | |
| JP | 2014015133 | 1/2014 | |
| NO | wo | 8/2020 | |
| WO | 2009147551 | 12/2009 | |

OTHER PUBLICATIONS

"Extended European Search Report", EP Application No. 21183558.2, dated Dec. 13, 2021, 13 pages.

"Search Report", GB Application No. 2109529.4, dated Aug. 19, 2021, 2 pages.

Buechel, et al., "An Automated Electric Vehicle Prototype Showing New Trends in Automotive Architectures", Oct. 2015, pp. 1274-1279.

Schumi, et al., "Short Circuit and Avalanche Effects in 12V Power Distribution for Automated Driving", Mar. 2019, 4 pages.

"Extended European Search Report", EP Application No. 22181071.6, dated Oct. 7, 2022, 8 pages.

* cited by examiner

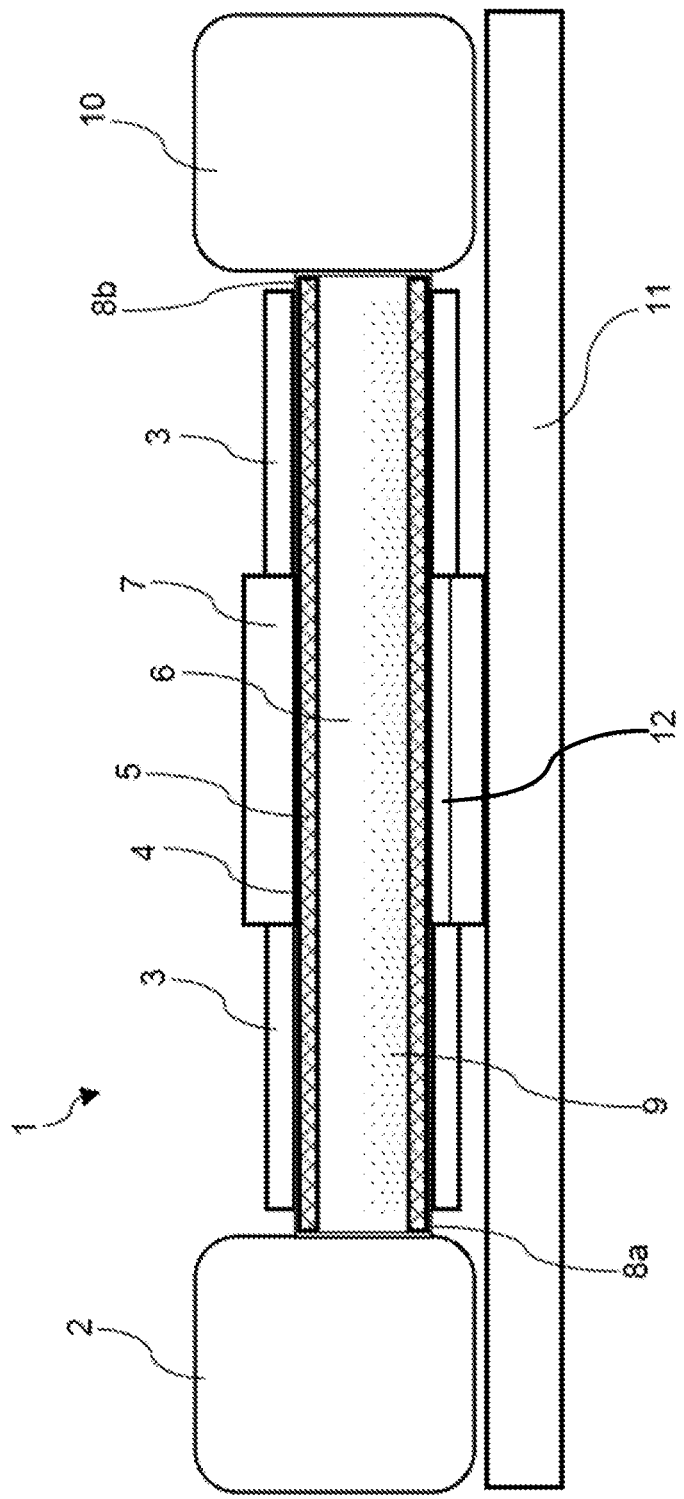

POWER CONDUCTOR AND VEHICLE POWER DISTRIBUTION CIRCUIT INCORPORATING THE SAME

INCORPORATION BY REFERENCE

This application claims priority to United Kingdom Patent Application Number GB2109529.4, filed on Jul. 1, 2021, the disclosure of which is incorporated by reference in its entirety.

BACKGROUND

Power distribution in modern vehicles is increasingly important, particularly with the growing adoption of driver assistance systems, electric vehicles, and autonomous driving technology. Greater power demands have meant that the current density in some areas of the vehicle, such as at power distribution units, have also increased. This leads to waste heat being generated and consequently has necessitated the need for cooling systems to mitigate the risk of overheating.

At the same time as the above, new vehicle electrical engineering (EE) architectures have looked to distribute power through a number of zonal hubs or modules as a way of reducing the length of wiring within the vehicle. For each hub or module, regulatory and energy management requirements necessitate that those power lines incorporate monitoring and protection systems in order to optimize and protect power distribution within the vehicle. As a consequence, further electronic systems and switches are introduced into the power line path. This not only exacerbates the power drain on the system, but also creates further heating points that require cooling.

The combination of the above factors means that not only have the power demands in modern vehicles increased, leading to greater heat dissipation, but also that there are more regions within the vehicle that are affected by this. This presents a significant problem because, as the temperature of a power line increases, so does its resistance, which leads to even greater thermal losses. For context, in some systems, an increase in temperature from 20° C. to 100° C. may cause the resistance on a power line to increase by around 70%. This effectively establishes a negative spiral because, as the temperature increases, the resistance of the power line increases, which in turn increases the power dissipation in the form of waste heat. Therefore, excessive heating degrades both performance and efficiency of power lines.

In view of the above, there is a need to cool power lines and other power conductors. Unfortunately, conventional cooling methods are not optimised for this application. For instance, passive or air cooling using a heatsink requires sufficient space and airflow. This rarely can be accommodated in the narrow channels used to convey wiring harnesses within the vehicle. Similarly, liquid cooling systems would require the introduction of additional pumps, tubing and radiators. This not only requires space, but also introduces further complexity and significant costs. There remains, therefore, a need for a cooling arrangement that provides efficient cooling to electronic wiring within a vehicle, and in particular a solution for cooling power conductors when there is very limited space and poor airflow.

SUMMARY

The present disclosure relates to a power conductor and, in particular, a heat dissipating power conductor. The present disclosure is particularly relevant to automotive power distribution wiring and automotive cooling arrangements for dissipating heat generated by the conduction of large currents through automotive power lines. The present disclosure also relates to a circuit, such as a vehicle power distribution circuit, incorporating such a power conductor.

According to a first example implementation, there is provided a power conductor for conducting electricity between a power source and a load, the power conductor including: a conductive body configured to connect the power source and the load; a sealed chamber in an interior of the conductive body; and a working fluid contained within the sealed chamber, the working fluid configured to change phase responsive to being heated.

In aspects, the conductive body includes a first connection terminal configured to connect to the power source and a second connection terminal configured to connect to the load.

In aspects, the power conductor further includes a lining layer lining the sealed chamber, wherein the lining layer includes a plurality of fluid channels configured to convey the working fluid by capillary action. In aspects, the lining layer forms a wick.

In aspects, the sealed chamber is sealed under a partial vacuum.

In aspects, the power conductor further includes a heatsink connector configured to thermally connect the conductive body to a heatsink.

In aspects, the heatsink connector includes an electrical insulator configured to electrically isolate the conductive body from the heatsink.

In aspects, the heatsink connector is configured to connect the conductive body to a vehicle structure, wherein the vehicle structure is configured to function as the heatsink.

In aspects, the working fluid is configured to vaporize from a liquid to a gas responsive to being heated.

In aspects, a vacuum in the sealed chamber and the working fluid are configured such that a boiling point of the working fluid corresponds to an operating temperature of the power conductor.

In aspects, the conductive body has a tubular construction. In aspects, the conductive body is formed as a heat pipe.

In aspects, the conductive body includes a metal envelope. In aspects, the conductive body is formed of copper.

In aspects, the conductive body is a flexible envelope.

In aspects, the power conductor further includes an electrical insulator covering a region of the conductive body, with the electrical insulator configured to prevent short circuiting to adjacent surfaces.

According to a second example implementation, there is provided a vehicle power distribution circuit including: a power source connection terminal configured to deliver current from a power source; a load connection terminal configured to deliver the current to a load; a power conductor configured to conduct electricity between the power source and the load, wherein the power conductor includes: a conductive body configured to connect between the power source connection terminal and the load connection terminal; a sealed chamber in an interior of the conductive body; and a working fluid contained within the sealed chamber, with the working fluid configured to change a phase responsive to being heated.

In aspects, the power conductor further includes a heatsink connector configured to connect the conductive body to a vehicle structure, wherein the vehicle structure is configured to function as a heatsink.

BRIEF DESCRIPTION OF THE DRAWING

An illustrative implementation will now be described with reference to the accompanying drawing in which:

The FIGURE shows a cross-sectional schematic view of a cooling device according to an illustrative implementation.

DETAILED DESCRIPTION

A vehicle electrical power conductor 1 according to an illustrative implementation is described with reference to the FIGURE. The power conductor 1 is used to electrically connect between a power source 2 and a load 10 within a vehicle power distribution circuit, and thereby forms a power line within the power distribution circuit. The power source 2 may be, for instance, a vehicle battery array, an alternator, a DC/DC converter, or the like used to supply electrical power within the vehicle. The load 10 may be, for instance, a distribution unit, a zonal controller, electronic control unit, or other power consuming component within the vehicle's EE architecture.

In some arrangements, power conductors can be formed with a high gauge wire or power cable for conducting current from the power source 2 to the load 10. The power conductor 1 may therefore replace such a high gauge wire or power cable used to connect the power source 2 and load 10.

The power conductor 1 can be realized with a heat pipe arrangement that uses thermal conductivity and phase transition to enhance heat-transfer. In these aspects, the power conductor 1 can include a conductive body 4 which contains a sealed chamber 6, with the chamber being lined by a wick 5 and containing a quantity of working fluid 9.

In the illustrated example implementation, the body 4 is provided as a rigid, hollow tubular structure. However, it will be understood that in other implementations, a flexible body may be provided. For example, the body may be formed as an articulated structure comprising one or more elements connected by linkages. In the illustrated implementation, the body 4 is formed of a copper material and the working fluid 9 is water. In other implementations, other conductive materials may be used, together with a compatible working fluid. Suitable working fluids include ammonia, methanol, and ethanol During manufacture, a vacuum pump is used to remove air from the interior chamber 6, and the chamber 6 is then partially filled with the working fluid 9.

The wick 5 is formed from a sintered metal powder resulting in a porous structure around the interior bore of the chamber 6, which is used to convey liquid working fluid 9. In other implementations, the wick layer may be formed from a mesh or from grooved channels provided parallel to the longitudinal axis of the body 4.

As shown, a heatsink connector 7 can be attached to the exterior of the body 4 and is used to thermally connect the body 4 to a thermally conductive structure 11 of the vehicle, such as the vehicle chassis or seat frame. The heatsink connector 7 incorporates a thin layer of insulating material 12, such as a mica sheet, for forming an electrical spacer between the conductive body 4 and the, e.g., vehicle structure 11. As such, the heatsink connector 7 electrically isolates the conductive body 4 from the vehicle structure 11, whilst allowing thermal heat transfer to it.

The exterior surface of the body 4, on either side of the heatsink connector 7, is substantially covered by an insulating layer 3 which forms a coating surrounding the body 4. The insulating layer 3 may be formed of a plastic coating or an insulating paint, and it prevents short circuiting once the body 4 is installed in the vehicle. The ends of the body 4 are exposed to form first and second connection terminals 8a-b for connection to the corresponding connection terminals for the power supply 2 and load 10.

In use, the load 10 draws current from the power source 2 through the electrically conductive body 4. As current is drawn, electrical resistance in the body 4 and at the connection terminals 8a-b generates hot spots where energy is dissipated. This causes heating of the body 4, which is transferred through the body's envelope to the working fluid 9 within the internal cavity or chamber 6. From a cold start, the working fluid 9 will be in a liquid form and, as the body is heated, the working fluid 9 is vaporised by absorbing heat from the interior surface of the body 4.

Once vaporised, the working fluid 9 vapor, driven by the pressure differential, travels along the interior chamber 6 to relatively cooler regions of the body 4, and specifically the region adjacent to the heatsink connector 7. Here, the relatively cooler interior surface of the chamber 6 will cause the working fluid 9 to condense back into a liquid and thereby release the latent heat stored therein. This heat transfer will be thermally conducted through the body 4 to the heatsink connector 7 and to the vehicle structure 11, where it can be dissipated over a large surface area. At the same time, the condensed liquid working fluid 9 will flow back to the warmer regions of the body 4 through capillary action through the wick 5. This cycle repeats, providing a very high heat transfer coefficient and ensuring highly effective thermal conduction throughout the body 4.

As will be understood, the mass of working fluid 9 is selected so that the interior chamber 6 contains both vapor and liquid over the intended operating temperature range of the associated parts of the distribution circuit. This thereby ensures enhanced (e.g., optimised) heat transfer. That is, although heat transfer by thermal conduction through the body 4 is still possible outside of this operating range, the heat-transfer advantage gained from thermal phase transition is reduced or lost. Specifically, below the range, the liquid working fluid 9 would be too cold to vaporize into a gas, and above the range, the temperature would be too high for the vaporised working fluid 9 to condense back into a liquid.

Advantageously, the above arrangement allows a vehicle power cable, such as the main power cables to powered modules and distribution units within the vehicle, to be replaced by an improved power conductor which also provides a thermal cooling capability. This heat pipe thermal cooling capability provides cooling for both the connected components and the conductor itself. For example, in practical applications, the power conductor 1 may be secured in place by fixtures, such as screws and clips, which would form hot spots that may otherwise increase the temperature of the surrounding components. The body 4 is, however, able to draw heat from these hot spots to the heatsink connector 7, thereby cooling the hotspots. Similarly, waste heat from the power source 2 and the load 10 may be drawn thorough the body 4 to the heatsink connector 7. This may help to optimise the performance and operating lifespan of these components. In both cases, the transferred heat may then be dissipated through the vehicle chassis or a seat structure, which can act as a large heatsink.

At the same time, because the power conductor 1 contains no mechanical moving parts, it requires no maintenance and provides long term reliability. The arrangement also does not require the space or airflow associated with conventional heatsink arrangements because waste heat can be conveniently conveyed to existing structures within the vehicle, or to a more conveniently located heatsink along the electrical conduction pathway. As such, the power conductor 1 may be incorporated into narrower spaces within the vehicle's structural framework compared to conventional heatsink or liquid cooling arrangements.

The improved thermal efficiency may further improve overall efficiency within the power distribution architecture by reducing power losses through the conductor. That is, because increasing temperature increases electrical resistance, improved cooling helps to mitigate the energy losses that would otherwise arise from an increased operating temperature.

Additionally, weight savings may also be provided because, by providing improved cooling efficiency, it is possible to reduce the conductor thicknesses that would otherwise be required. That is, in other arrangements, the required power line diameter would typically be determined based, at least in part, on the maximum allowable resistance at the highest expected operating temperature. As such, by lowering the operating temperature though improved thermal management, as is described herein, thinner power conductors may be used. This may thereby provide weight and cost savings.

It will be understood that the implementations illustrated above show applications only for the purposes of illustration. In practice, implementations may be applied to many different configurations, the detailed implementations being straightforward for those skilled in the art to implement.

What is claimed is:

1. A power conductor for conducting electricity, the power conductor comprising:
   a conductive body configured to connect a power source and a load in a vehicle distribution circuit within a vehicle structure;
   a sealed chamber in an interior of the conductive body;
   a working fluid contained within the sealed chamber, the working fluid configured to change phase responsive to being heated;
   a heatsink connector distinct and separate from the conductive body and thermally connecting the conductive body to the vehicle structure, wherein the heatsink connector surrounds i) a circumference of the conductive body, and ii) only a portion of the conductive body, and wherein the vehicle structure functions as a heatsink; and
   an electrical insulator distinct and separate from the heatsink connector and disposed between the conductive body and a first portion of the heatsink connector in an area adjacent the vehicle structure, wherein the electrical insulator is not disposed between a second portion of the heatsink connector and the conductive body, and wherein the second portion is on an opposite side of the conductive body than the vehicle structure.

2. The power conductor of claim 1, wherein the conductive body comprises:
   a first connection terminal configured to connect to the power source; and
   a second connection terminal configured to connect to the load.

3. The power conductor of claim 1, further comprising:
   a lining layer lining the sealed chamber,
   wherein the lining layer includes a plurality of fluid channels configured to convey the working fluid by capillary action.

4. The power conductor of claim 1, wherein the sealed chamber is sealed under a partial vacuum.

5. The power conductor of claim 2, wherein the heatsink connector for thermally connecting the conductive body to the vehicle structure is located along a length of the conductive body between the first connection terminal and the second connection terminal.

6. The power conductor of claim 1, wherein the working fluid is configured to vaporize from a liquid to a gas responsive to being heated.

7. The power conductor of claim 1, wherein:
   the sealed chamber has a vacuum; and
   the vacuum of the sealed chamber and the working fluid are configured such that a boiling point of the working fluid corresponds to an operating temperature of the power conductor.

8. The power conductor of claim 1, wherein the conductive body has a tubular construction.

9. The power conductor of claim 1, wherein the conductive body comprises a metal envelope.

10. The power conductor of claim 1, wherein the conductive body comprises a flexible envelope.

11. A circuit comprising:
    a power source connection terminal configured to deliver a current from a power source;
    a load connection terminal configured to deliver the current to a load in a vehicle distribution circuit within a vehicle structure; and
    a power conductor configured to conduct electricity between the power source connection terminal and the load connection terminal, the power conductor including:
      a conductive body configured to connect between the power source connection terminal and the load connection terminal;
      a sealed chamber in an interior of the conductive body;
      a working fluid contained within the sealed chamber, the working fluid configured to change phase responsive to being heated;
      a heatsink connector distinct and separate from the conductive body and configured to connect the conductive body to the vehicle structure, wherein the heatsink connector surrounds i) a circumference of the conductive body, and ii) only a portion of the conductive body, and wherein the vehicle structure is configured to function as a heatsink; and
      an electrical insulator distinct and separate from the heatsink connector and disposed between the conductive body and a first portion of the heatsink connector in an area adjacent the vehicle structure, wherein the electrical insulator is not disposed between a second portion of the heatsink connector and the conductive body, and wherein the second portion is on an opposite side of the conductive body than the vehicle structure.

12. The circuit of claim 11, wherein:
    the power conductor further includes a wick lining the sealed chamber of the power conductor; and
    the wick comprises sintered metal powder.

13. A vehicle comprising:
    a power source connection terminal configured to deliver a current from a power source;
    a load connection terminal configured to deliver the current to a load in a distribution circuit of the vehicle within a structure of the vehicle; and a power conductor configured to conduct electricity between the power source and the load, the power conductor including:
  a conductive body configured to connect between the power source connection terminal and the load connection terminal;
  a sealed chamber in an interior of the conductive body;
  a working fluid contained within the sealed chamber, the working fluid configured to change phase responsive to being heated;
  a heatsink connector distinct and separate from the conductive body and configured to connect the conductive body to the structure of the vehicle, wherein the heatsink connector surrounds i) a circumference of the conductive body, and ii) only a portion of the conductive body, and wherein the structure of the vehicle is configured to function as a heatsink; and
  an electrical insulator distinct and separate from the heatsink connector and disposed between the conductive body and a first portion of the heatsink connector in an area adjacent the structure of the vehicle, wherein the electrical insulator is not disposed between a second portion of the heatsink connector and the conductive body, and wherein the second portion is on an opposite side of the conductive body than the vehicle structure.

14. The vehicle of claim 13, wherein the heatsink of the vehicle comprises at least one of:
  a vehicle chassis; or
  a seat frame.

15. The vehicle of claim 13, wherein a mass of the working fluid is configured such that the sealed chamber of the conductive body contains vapor and liquid over an operating temperature range of the vehicle at the power conductor.

16. The power conductor of claim 6, wherein the sealed chamber is configured such that the working fluid in its vapor state is driven by a pressure differential to a region adjacent to the heatsink connector.

17. The power conductor of claim 7, wherein the operating temperature is between 20 and 100 degrees Celsius.

18. The power conductor of claim 1, wherein the working fluid comprises at least one of ammonia, methanol, and ethanol.

19. The power conductor of claim 1, further comprising a first insulating layer surrounding a circumference of the conductive body in a first area not surrounded by the heatsink connector.

20. The power conductor of claim 19, wherein the first area is i) between the power source and the heatsink connector, or ii) between the heatsink connector and the load.

21. The power conductor of claim 19, further comprising a second insulating layer surrounding a circumference of the conductive body in a second area not surrounded by the heatsink connector and the first insulating layer.

22. The power conductor of claim 21, wherein the heatsink is disposed between the first insulating layer and the second insulating layer.

* * * * *

UNITED STATES PATENT AND TRADEMARK OFFICE
CERTIFICATE OF CORRECTION

PATENT NO. : 12,016,161 B2
APPLICATION NO. : 17/810501
DATED : June 18, 2024
INVENTOR(S) : Guillaume Tournabien et al.

Page 1 of 1

It is certified that error appears in the above-identified patent and that said Letters Patent is hereby corrected as shown below:

On the Title Page

Page 2, Column 2, Foreign Patent Documents, Line 6: Delete "NO wo" and insert --WO 2020162808-- therefor Signed and Sealed this
Eighth Day of April, 2025

Coke Morgan Stewart
*Acting Director of the United States Patent and Trademark Office*